United States Patent [19]

Hsue et al.

[11] Patent Number: 5,661,081
[45] Date of Patent: Aug. 26, 1997

[54] METHOD OF BONDING AN ALUMINUM WIRE TO AN INTERGRATED CIRCUIT BOND PAD

[75] Inventors: Chen-Chiu Hsue; Sun-Chieh Chien, both of Hsin-Chu; Anchor Chen, Chu-Tung; Gary Hong, Hsin-Chu, all of Taiwan

[73] Assignee: United Microelectronics Corporation, Hsin-Chu, Taiwan

[21] Appl. No.: 316,083

[22] Filed: Sep. 30, 1994

[51] Int. Cl.$^6$ .................. H01L 21/283; H01L 21/603
[52] U.S. Cl. .................. 438/106; 438/654; 438/655; 438/612
[58] Field of Search .................. 437/193, 195, 437/200, 183 WB, 209 WB; 257/755, 756, 757; 148/19

[56] References Cited

U.S. PATENT DOCUMENTS

| | | | |
|---|---|---|---|
| 4,278,989 | 7/1981 | Baba et al. | 437/193 |
| 4,364,166 | 12/1982 | Crowder et al. | 29/571 |
| 4,398,335 | 8/1983 | Lehrer | 29/577 C |
| 4,600,658 | 7/1986 | Anderson et al. | 428/450 |
| 4,800,177 | 1/1989 | Nakamae | 437/193 |
| 4,916,397 | 4/1990 | Masuda et al. | 357/71 |
| 4,948,747 | 8/1990 | Pfiester | 437/60 |
| 4,984,056 | 1/1991 | Fujimoto et al. | 357/67 |
| 5,036,383 | 7/1991 | Mori | 357/71 |
| 5,057,447 | 10/1991 | Paterson | 437/43 |
| 5,102,827 | 4/1992 | Chen et al. | 437/200 |
| 5,373,192 | 12/1994 | Eguchi | 257/774 |
| 5,432,129 | 7/1995 | Hodges | 437/193 |

FOREIGN PATENT DOCUMENTS

| | | | |
|---|---|---|---|
| 57-37856 | 3/1982 | Japan . | |
| 58-23451 | 2/1983 | Japan | 437/193 |
| 60-193333 | 10/1985 | Japan . | |
| 61-283146 | 12/1986 | Japan . | |
| 62-117368 | 5/1987 | Japan . | |
| 62-291145 | 12/1987 | Japan . | |
| 63-12152 | 1/1988 | Japan . | |
| 63-50042 | 3/1988 | Japan . | |
| 63-99547 | 4/1988 | Japan . | |
| 1-42153 | 2/1989 | Japan | 437/183 |
| 263127 | 3/1990 | Japan . | |
| 2114532 | 4/1990 | Japan . | |
| 2-144921 | 6/1990 | Japan | 257/757 |
| 2203526 | 8/1990 | Japan . | |
| 377343 | 4/1991 | Japan . | |
| 5-335306 | 12/1993 | Japan | 257/755 |
| 2077993 | 12/1981 | United Kingdom . | |

*Primary Examiner*—David Graybill
*Attorney, Agent, or Firm*—William H. Wright

[57] ABSTRACT

A process for manufacturing bonding pad adapted for use with an aluminum wire that resists stresses that would otherwise peel the pad from the substrate. The pad has a polysilicon layer adhered to an insulating layer on a semiconductor substrate, a overlying refractory metal polycide layer, a second polysilicon layer, a refractory metal layer, and a thick aluminum alloy bonding pad.

15 Claims, 4 Drawing Sheets

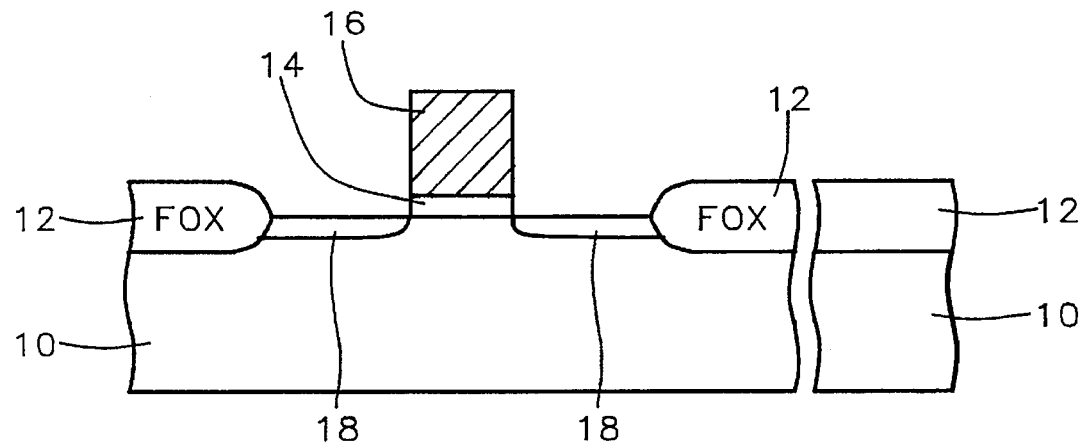
FIG. 1A – Prior Art
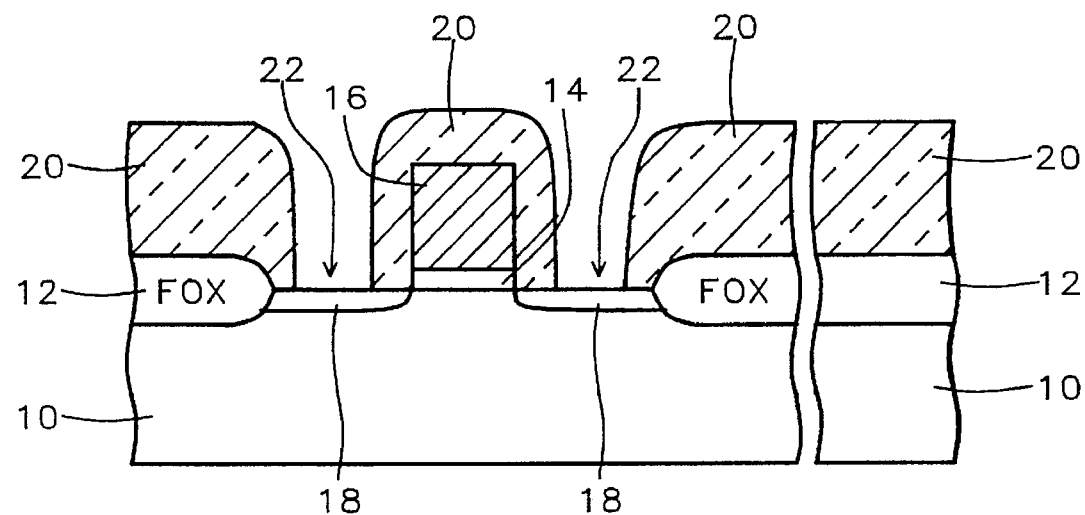
FIG. 1B – Prior Art

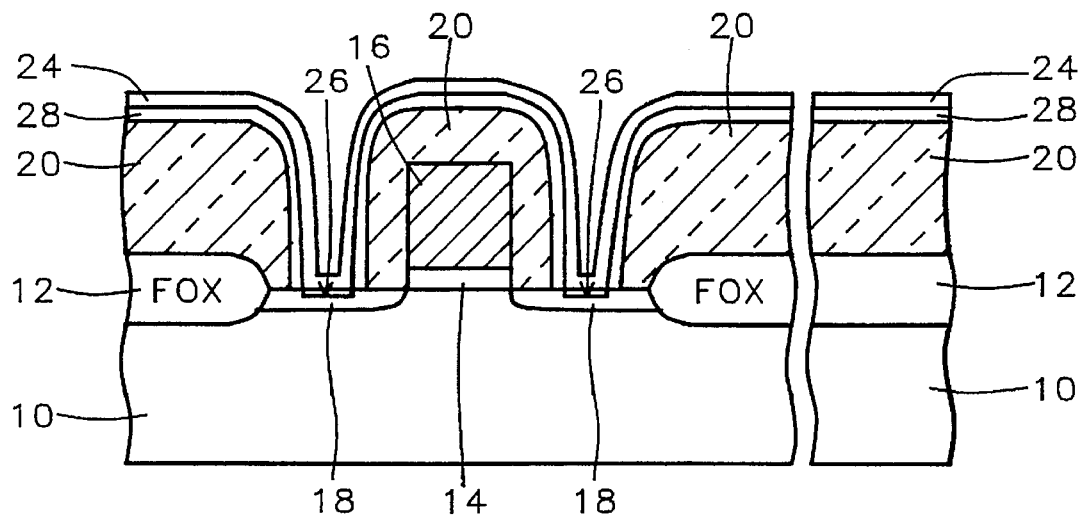
FIG. 1C – Prior Art
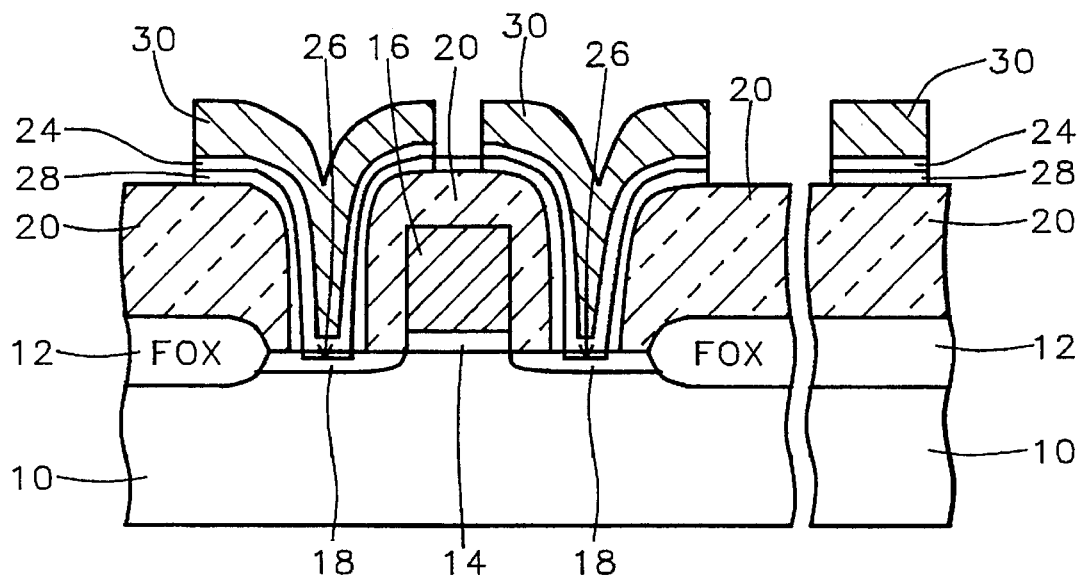
FIG. 1D – Prior Art

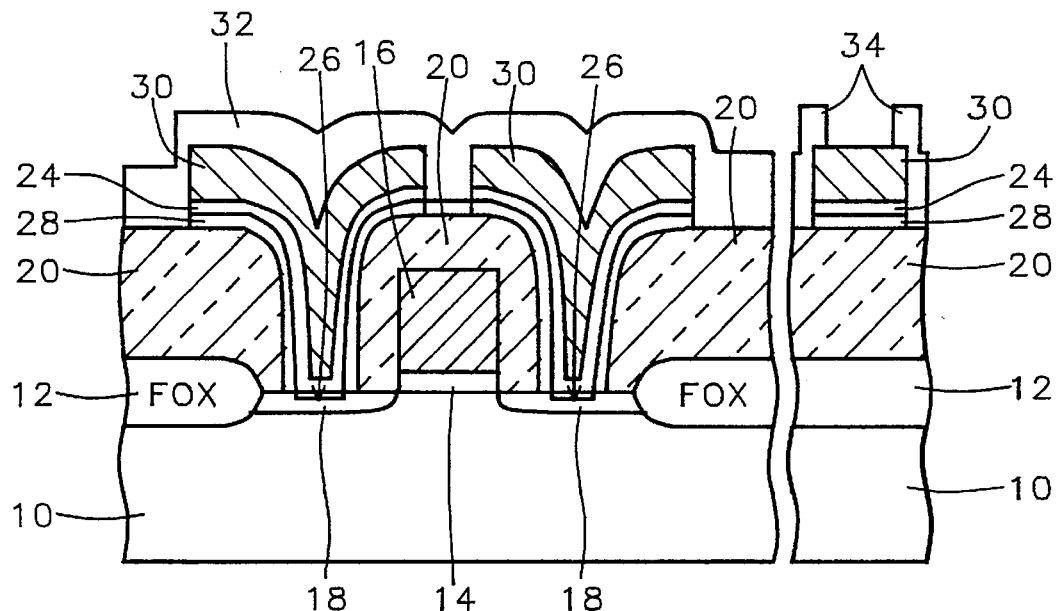
FIG. 1E – Prior Art
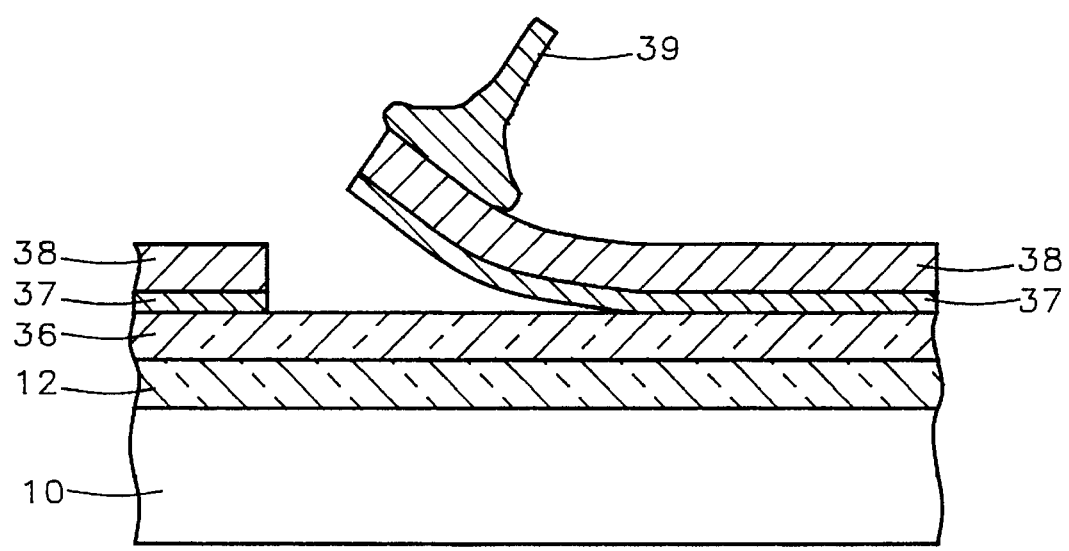
FIG. 2 – Prior Art

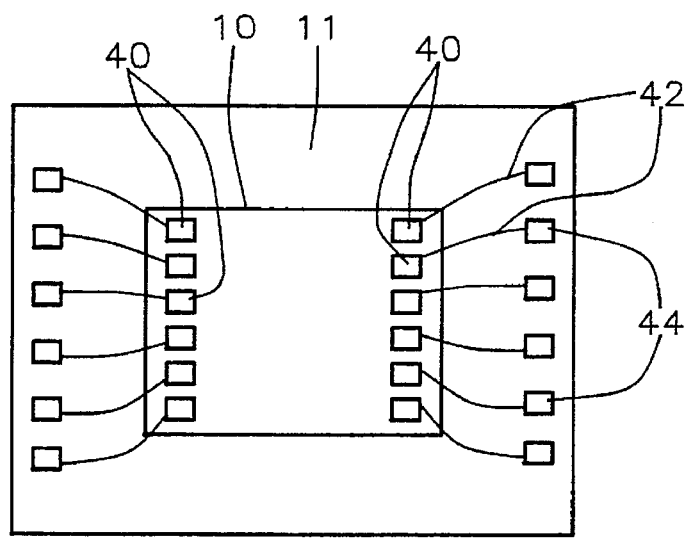
*FIG. 3 - Prior Art*
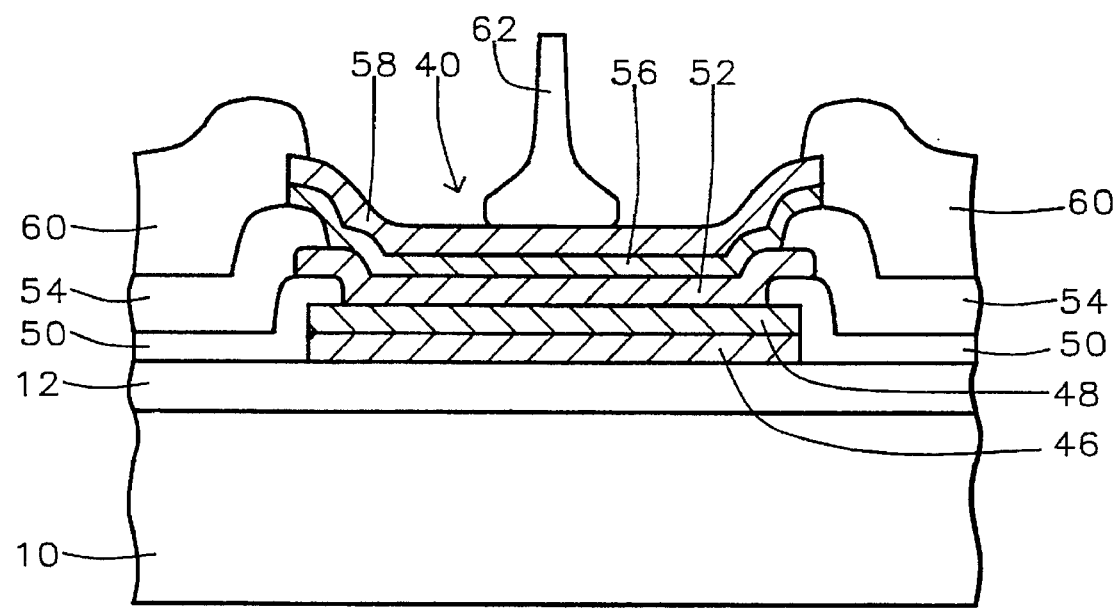
*FIG. 4*

METHOD OF BONDING AN ALUMINUM WIRE TO AN INTERGRATED CIRCUIT BOND PAD

BACKGROUND OF THE INVENTION (1) Field of the Invention

The present invention relates, in general, to electrical connections to semiconductor devices, and more particularly to an improved bonding pad for bonding an Al wire thereto, and the method of forming the connection.

(2) Description of the Prior Art

Wire bonding has been widely used in the semiconductor industry to electrically connect device terminals, i.e. bonding pads, to terminals on associated devices, and also terminals on supporting package structures. The ends of the wires are connectionally fused to bonding pads by thermocompression bonding where localized heating at the wire—pad interface is promoted by very rapidly moving the wire to generate heat by friction. This heating causes localized melting and subsequent fusion of the pad and wire. As the degree of microminiaturization of semiconductor devices increased, the bonding pads became smaller, more numerous on the device, and more closely spaced. This increased the stress per unit area that is applied to the bonding pad during the bonding operation and also the thermal stress applied as the device temperatures fluctuates during operation. In addition automated bonding apparatus for bonding wires operate at increasingly higher speeds which increase the stress applied to the pad through the wire. When Au wires are used, the present bonding pad technology appears to be adequate to handle the stress. However, gold (Au) is expensive. With the increased emphasis on cost control of integrated circuit semiconductor devices, and the associated package structure, the use of wires made of less expensive metal becomes very important and desirable. Aluminum (Al) wires, which is less expensive than Au wire, has been used for electrical connections. However, the use of Al wires impose greater stress due primarily to its greater coefficient of expansion on the thermal bonding pads resulting in drastically reduced yield. The terminal failure seems to occur most frequently during thermal cycling. The terminal bonding pad separates from the support surface, or at the interfocus of various metal layers of the pad.

The separation of the bonding pad from the substrate is illustrated in FIG. 2. The bonding wire 39, typically aluminum, is bonded to an aluminum or aluminum alloy layer 38, which is in turn bonded to a barrier layer 37, typically a refractory metal layer such as titanium nitride, titanium/tungsten, or titanium. The barrier layer 37 is initially bonded to an insulating layer 36, typically borophosphosilicate glass (BPSG), which in turn is bonded to layer 12, typically silicon oxide. As indicated in FIG. 2 the wire 39 can peel away the underlying pad causing a potential connection failure. The failure may occur immediately during the thermal cycle of the package process (for example during a high temperature molding process). Any thermal cycling may cause large stress and the resultant peeling failure. The poor package yields show that the package thermal cycling process causes the peeling during the high temperature molding process.

In the fabrication of VLSI circuits, a diffusion barrier layer, such as titanium/titanium nitride:tungsten (Ti/TiN:W), has been widely introduced between aluminum alloy and silicon contact to avoid the abnormal interfacial diffusion and increase the circuit lifetime. However, an unstable compound of titanium silicon oxide (TiSixOy) is normally formed between Ti layer and underlying dielectric, e.g. BPSG (borophosphosilicate glass). This unstable compound has poor adhesion to the underlying BPSG and always results in bad bonding yield of the connection from circuit pad to device.

In order that the disadvantage of the above-mentioned conventional technique can be better understood, the process of fabricating conventional VLSI circuits is described hereinafter with reference to FIGS. 1a to 1e.

Referring now to FIG. 1a, a Si substrate 10 is laterally isolated with a field oxide 12 with a thickness of 3000 to 8000 Angstroms by using for example LOCOS (Local Oxidation of Silicon) technology so that an active region is formed on the Si substrate 10. The isolation region, i.e. the field oxide 12, may be formed by other conventional methods understood by those skilled in this art, for example by the trenched dielectric method. After the isolated field oxide 12 is formed, a gate oxide layer 14 is formed over the active region and a doped polysilicon or polycide layer deposited. The layers are etched to form the gate oxide 14 and gate electrode 16. Thereafter, the N+ (or P+) source/drain regions 18 are formed by implanting with suitable impurities. In some VLSI circuits, lightly doped drain (LDD) or double diffused drain (DDD) structures or the like are used.

The next step may be seen with reference to FIG. 1b where a premetal dielectric $SiO_2$ layer 20, typically borosilicate glass (BSG) or borophosphosilicate glass (BPSG) with a thickness of between about 3000 to 10,000 Angstroms is deposited followed by a high temperature densification. The densification involved placing wafers in a high temperature ambient to make the deposited premetal dielectric $SiO_2$ layer 20 densified and stable. Metal contact windows 22 are then formed on the densified premetal dielectric $SiO_2$ layer 20 by dry and/or wet etching.

The next step is shown in FIG. 1c wherein diffusion barrier layers TiN 24/$TiSi_2$ 26 are formed on the metal contact windows 22, and TiN 24/TiSixOy 28 layers are formed on the premetal dielectric $SiO_2$ layer 20. The formation of diffusion barrier layer is completed by sputtering Ti, followed by rapid thermal annealing in a nitrogen atmosphere to form the $TiSi_2$ and TiSixOy layers adjacent the source/drain regions 18 and on the dielectric layer 20, respectively, and the TiN layer in those portions in contact with the nitrogen atmosphere. Alternatively, the diffusion barrier layer can be formed by sputtering a bi-layered structure of Ti and TiN, or Ti and Ti:W, followed by the same rapid thermal annealing.

Referring now to FIG. 1d, a metal layer 30 is deposited on the surface of the substrate such as Al-Si(0–2%)-Cu (0.5–4%) (aluminum silicon copper) with a thickness of about 4000 to 10000 Angstroms. The metal layer 30 is then patterned using conventional lithography and etching techniques to form the patterns as shown in the drawing.

The final step involves depositing a passivation layer 32, typically $SiO_2$ and $Si_3N_4$ layers with a total thickness of about 5000 to 20000 Angstroms by chemical vapor deposition (CVD), patterning and then forming a pad area 34 by masking and etching the passivation layer 32. The finished VLSI circuit is shown in cross section FIG. 1e.

According to the above conventional technique for fabricating VLSI circuits, the presence of the diffusion barrier layers 24 and 26 is used to get rid of aluminum spiking and silicon precipitate on contacts 22. Al-Si-Cu alloys are used as the metal layer 30 for the purpose of solving the aluminum spiking problem. However, using Al-Si-Cu alloys always results in an excessive amount of Si precipitation on the surface of the Si substrate 10 underlying the metal contact windows 22, then increasing the resistivity thereof. Moreover, with the scaling down of the device dimensions in VLSI circuits, it is desired to increase the stepcoverage of the metal layer of metal contact windows 22, and thus a higher sputtering temperature may be used. This will worsen the silicon precipitation problem. In order to solve the above problem, diffusion barrier layers of TiN 24/TiSi$_2$ 26 are formed on metal contact windows 22. However, this step also forms a unstable TiSixOy layer 28 on premetal dielectric SiO$_2$ layer 20. As this unstable layer 28 exhibits poor adhesion to the underlying premetal dielectric SiO$_2$ layer 20, it results in bad pad bonding yields when wire (not shown) to pad 30 is bonded.

U.S. Pat. No. 4,600,658 to Anderson et al, describes a bonding pad for semiconductor device that uses a barrier layer. U.S. Pat. No. 4,800,177 to Nakamae and U.S. Pat. No. 5,057,447 to Paterson also illustrate device structure that use various configurations of bonding pads.

Copending and commonly assigned U.S. patent application Ser. No. 08/207,559, filed Mar. 7, 1994, describes a solution for the same problem addressed by this application. However, the terminal bonding pad and method differ from the bonding pad and method of this application.

SUMMARY OF THE INVENTION

An object of this invention is to provide an improved terminal bonding pad particularly adapted for use with an Al wire.

Another object of the invention is to provide a new method for establishing an electrical connection with Al wire between a device and a support package.

In the method of making a bonding pad terminal of the invention on a semiconductor device for attachment of an Al wire, a first polycrystalline silicon pad with an overlying refractory metal polycide layer is deposited on an insulating layer on the device. A second polycrystalline silicon layer is deposited over the polycide layer. Subsequently, a refractory metal layer and a Al alloy pad are deposited over the second polycrystalline silicon layer. An Al wire can be bonded to the Al alloy pad.

BRIEF DESCRIPTION OF THE DRAWINGS

FIGS. 1a through 1e is a sequence of cross sectional views, in broken section and in greatly enlarged scale, that depict a prior art process for producing a device and an associated terminal bonding pad structure.

FIG. 2 is a a crossectional view, in broken section, showing a typical bonding terminal failure. FIG. 3 is a top view of a typical device supported on a substrate illustrating the wires and terminal bonding pads for electrically connecting the device and substrate.

FIG. 4 is a crossectional view in broken section, which illustrates the layered structure of a preferred embodiment of the terminal bonding pad of the invention.

DESCRIPTION OF THE PREFERRED EMBODIMENT

FIG. 3 illustrates a typical usage of the terminal bonding pad of the invention. A semiconductor device 10 is shown mounted on a package substrate 11. Device 10 can be any type of integrated circuit semiconductor device having numerous active and passive devices fabricated therein which are interconnected by suitable metallurgy layer. A typical example of use is on a SRAM device. The input and outputs of the device 10 are the terminal bonding pads 40. Wires 42 are each bonded at one end to pads 40, and at the opposite end to pads 44 on substrate 11.

Referring now to FIG. 4, there is illustrated a crossection view of the terminal bond pad 40 of the invention. Pad 40 is typically mounted on monocrystalline silicon substrate 10 provided with an insulating layer 12. Layer 12 is normally a field oxide layer formed of thermal silicon oxide which was described previously. A first layer 46 of polycrystalline silicon is deposited on layer 12. Layer 46 preferably has a thickness in the range of 500 to 2500 Angstroms. A layer 48 of a refractory metal is deposited over layer 46. The refractory metal of layer 48 is preferably tungsten. Other suitable metals are titanium, platinum and paladium.

If convenient, layers 46 and 48 can be part of the metallurgy system used to interconnect the active and passive devices on substrate 10. Layers 46 and 48 are shaped using conventional photolithographic and etching techniques. A first insulating layer 50 is then deposited over layer 48 and over the top outside peripheral edge surface of layer 48. Layer 50 is preferably formed of silicon oxide or silicon nitride and has a thickness in the range of between about 1000 to 3000 Angstroms.

A second layer 52 of polycrystalline silicon is deposited over polycide layer 48 and overlaps the inside top peripheral edge surface of layer 50. Layer 52 has a thickness greater than 800 Angstroms, more preferably in the range of about 800 to 2000 Angstroms. Layer 52 must have a thickness greater than 800 Angstroms in order to provide the pad with the necessary strength to resist the tearing away of an Al layer by the Al terminal wire. A second insulating layer 54 is deposited over layer 50 and also over the outside peripheral edge surface of layer 52. Layer 54 is preferably BPSG with a thickness in the range of between about 3000 to 10000 Angstroms. Subsequently a barrier layer 56 of a refractory material is deposited over layer 52 and the inside peripheral edge surface of layer 54. The layer 56 can be titanium nitride, titanium-tungsten/titanium or titanium-tungsten nitride/titanium, and preferably a layer of titanium nitride/titanium with a thickness in the range of 800 to 2000 Angstroms. A thicker aluminum alloy layer 58 of about 8000 to 15000 Angstroms thick is deposited over layer 56. Layer 58 is preferably an alloy consisting of Al, 1.0% Si and 0.5% Cu. The layer 54 and 56 is preferably heated to a temperature in the range of about 600° to 800° C. for a time in the range of about 20 to 60 seconds. This heating forms a strong bond between layer 52 and 54, and between layers 54 and 56. The heating step can be done when other fabrication processes that require heat are performed on the device. A third insulating layer 60 is deposited over layer 54 and the outside peripheral top edge surface of layer 58. Layer 60 can be any suitable insulating material, typically SiN or phosphosilicate glass (PSG). Layer 60 preferably has a thickness in the range of one to two micrometers. All of the aforedescribed layers are deposited and shaped by conventional deposition and photolithographic and etching techniques known to the prior art. An aluminum wire 62 can now be thermocompression bonded to the bonding pad layer.

While the invention has been particularly shown and described with reference to the preferred embodiments thereof, it will be understood by those skilled in the art that various changes in form and details may be made without departing from the spirit and scope of the invention.

What is claimed is:

1. A method of forming an improved connection between an aluminum wire and a terminal pad on an integrated circuit semiconductor device provide with a surface insulating layer, the method comprising:

forming a first polycrystalline layer on a surface of the surface insulating layer;

depositing a first refractory metal layer over the first polycrystalline silicon layer;

depositing a second polycrystalline silicon layer onto a surface of the first refractory metal layer so that the second polycrystalline silicon layer is in contact with the first refractory metal layer over a central wire bonding region, the second polycrystalline silicon layer having a thickness in excess of 800 Angstroms;

depositing a second refractory metal layer over the second polycrystalline silicon layer;

heating the device to form first and second refractory metal silicide layers over the first and second polycrystalline silicon layers;

depositing a bonding pad layer of aluminum or an aluminum alloy over the second refractory metal layer; and thermocompression bonding an aluminum wire to the bonding pad layer.

2. The method of claim 1 wherein the first refractory metal silicide layer is tungsten silicide.

3. The method of claim 2 wherein the thickness of the first polycrystalline silicon layer is in the range of about 500 to 2500 Angstroms.

4. The method of claim 2 which further includes depositing a first layer of insulation material over the surface insulating layer and over a peripheral portion of edges of the first layer of refractory metal silicide and removing the first layer of insulation material from above a central portion of the first layer of refractory metal silicide.

5. The method of claim 4 wherein the thickness of the second polycrystalline silicon layer is in the range of about 800 to 2000 Angstroms.

6. The method of claim 1 wherein the second refractory metal layer is titanium.

7. The method of claim 5 wherein the second polycrystalline silicon layer overlies the top peripheral edge surface of the first insulation layer.

8. The method of claim 7 which further includes depositing a second insulation layer over the first insulation layer.

9. The method of claim 8 wherein the second insulation layer overlies a peripheral portion of edges of the second polycrystalline silicon layer and the second insulation layer is removed from above a central portion of the second polycrystalline silicon layer.

10. The method of claim 9 which further includes depositing a third insulation layer over the second insulation layer.

11. The method of claim 10 wherein the third insulation layer overlies a peripheral portion of edges of the bonding pad layer and the third insulation layer is removed from above a central portion of the bonding pad layer.

12. The method of claim 11 wherein the bonding pad layer and second refractory metal layer overly the peripheral portion of edges of the second insulation layer.

13. The method of claim 1 wherein the thickness of the bonding pad layer is in the range of about 8000 to 15000 Angstroms.

14. The method of claim 1 wherein the second layer of refractory metal is titanium nitride and titanium.

15. The method of claim 1 wherein the second layer of refractory metal is heated to a temperature in the range of about 600° to 800° C. for a time of 20 to 60 seconds.

* * * * *